(12) United States Patent
Gupta

(10) Patent No.: US 7,851,930 B1
(45) Date of Patent: Dec. 14, 2010

(54) CONDUCTIVE ADHESIVE COMPOSITIONS CONTAINING AN ALLOY FILLER MATERIAL FOR BETTER DISPENSE AND THERMAL PROPERTIES

(75) Inventor: Shashi Gupta, Tustin, CA (US)

(73) Assignee: Henkel Corporation, Rocky Hill, CT (US)

( * ) Notice: Subject to any disclaimer, the term of this patent is extended or adjusted under 35 U.S.C. 154(b) by 0 days.

(21) Appl. No.: 12/475,634

(22) Filed: Jun. 1, 2009

Related U.S. Application Data

(60) Provisional application No. 61/058,696, filed on Jun. 4, 2008.

(51) Int. Cl.
*H01L 29/40* (2006.01)
*H01L 23/28* (2006.01)

(52) U.S. Cl. .............. 257/787; 257/778; 257/782; 257/783

(58) Field of Classification Search .......... 257/778, 257/785, 783, 787
See application file for complete search history.

(56) References Cited

U.S. PATENT DOCUMENTS

| | | | |
|---|---|---|---|
| 4,147,669 A | 4/1979 | Shaheen et al. ............ 252/512 |
| 6,034,194 A | 3/2000 | Dershem et al. ............ 526/262 |
| 6,211,320 B1 | 4/2001 | Dershem et al. ......... 526/329.1 |
| 6,225,379 B1 * | 5/2001 | Kwak et al. ................ 523/457 |
| 6,429,382 B1 * | 8/2002 | Amami et al. .............. 174/259 |
| 6,500,891 B1 | 12/2002 | Kropp et al. ................ 524/430 |
| 6,521,731 B2 | 2/2003 | Dershem et al. ............ 526/262 |
| 6,916,433 B2 * | 7/2005 | Mitani et al. ................ 252/500 |
| 2002/0050585 A1 * | 5/2002 | Masayuki et al. ........... 252/500 |
| 2002/0140082 A1 * | 10/2002 | Matayabas .................. 257/706 |
| 2003/0080437 A1 * | 5/2003 | Gonzalez et al. ........... 257/778 |
| 2007/0200133 A1 * | 8/2007 | Hashimoto et al. ......... 257/100 |
| 2007/0278683 A1 * | 12/2007 | Santos et al. ................ 257/759 |
| 2008/0122088 A1 * | 5/2008 | Todd et al. .................. 257/741 |

* cited by examiner

*Primary Examiner*—Matthew C Landau
*Assistant Examiner*—James M Mitchell
(74) *Attorney, Agent, or Firm*—Steven C. Bauman

(57) ABSTRACT

An adhesive composition having thermal conductivity as well as excellent dispensability properties is provided. The adhesive composition includes a curable resin component, a curing agent for the curable resin component, and a conductive filler material. The filler material is an alloy of copper and silver. The specific ratios of the copper and silver in the alloy are tailored so as to provide the adhesive composition with appropriate thermal conductivity and dispensing properties making the composition particularly useful for application in the semiconductor industry.

12 Claims, 2 Drawing Sheets

CONDUCTIVE ADHESIVE COMPOSITIONS CONTAINING AN ALLOY FILLER MATERIAL FOR BETTER DISPENSE AND THERMAL PROPERTIES

BACKGROUND

1. Field

The invention relates to adhesive compositions for bonding substrates, and more particularly to adhesive compositions including a curable resin component, a curing agent, and a conductive filler material. The adhesive compositions exhibit excellent thermal conductivity and can be easily and cleanly dispensed, particularly in die attach applications for the micro-electronics industry.

2. Related Technology

Adhesive compositions play a prominent role in many industrial applications. For example, in the micro-electronics industry, packaging engineers faced with increased challenges of finding new and better ways of creating and attaching dies often rely on adhesive compositions to secure semiconductor chips to a circuit board or other substrate during the die attach process. In particular, as micro-electronic devices, such as semiconductor packages, have become smaller and more powerful, the micro-electronic packaging industry has started to stack multiple semiconductor die into the same package to increase circuit density without increasing the total area of the circuit board which is occupied.

In order to obtain better performance of electrical components, including these stacked die packages, the adhesive bond line interface between the components needs to be very thin while still maintaining superior adhesive strength and high thermal and electrical conductivity to avoid the reduced reliability, slower performance, and reduced power-handling capacity that can result from heat and electrical buildup. The resin bleed often leads to unreliable performance. In addition, the rheology of the adhesive composition should allow for the rapid dispensing of individual units, or dots, of adhesive of predicable size and shape.

Thermally conductive adhesives have been an important interface material in semiconductor die attach technology. Especially important are adhesives that are fluid during application and can penetrate interfacial or surface voids, effectively lowering interfacial thermal and electrical resistance.

The thermal conductivity of these adhesives may be improved by the addition of a conductive filler material to the resin matrix. For example, U.S. Pat. No. 4,147,669 (Shaheen) discloses an adhesive matrix with a filler material comprised of gallium, aluminum, gold, copper, or silver in a resin. U.S. Pat. No. 6,500,891 (Kropp et al.) describes a thermally conductive adhesive including a resin mixed with a filler material which includes spherical alumina particles. However, because these filler materials are naturally abrasive, including the high amount of filler material within the resin matrix necessary to obtain the desired conductivity properties makes it difficult to dispense the adhesive into tight spaces using a needle tip with the rate and consistency necessary in high-speed dispensing systems.

SUMMARY

In one aspect an adhesive composition is provided, and in particular an adhesive composition that includes a curable resin component, a curing agent, and a filler material comprising an alloy of copper and silver, wherein the alloy comprises from about 45% to about 85% by weight copper based on the total weight of the alloy.

In another aspect, an assembly comprised of a first substrate, a second substrate, and a layer of an adhesive composition is provided. The adhesive composition includes a curable resin component, a curing agent, and a filler material comprising an alloy of copper and silver, wherein the alloy comprises from about 45% to about 85% by weight copper based on the total weight of the alloy.

In another aspect, a dispensable composition, comprising a curable resin component, a curing agent, and a filler material comprising an alloy of copper and silver is provided. The dispensable composition has a thermal resistance of between about 4.0 and about 5.0 K/W and a 1 rpm/20 rpm thixotropy value of below 3.0, when the filler material is present in an amount of 80% by weight of the composition.

In another aspect, a method of forming an assembly comprising a first substrate, a second substrate, and a layer of an adhesive composition is provided. The adhesive composition includes a curable resin component, a curing agent, and a filler material comprising an alloy of copper and silver, wherein the alloy comprises from about 45% to about 85% by weight copper based on the total weight of the alloy is provided.

DETAILED DESCRIPTION

Figure 1:
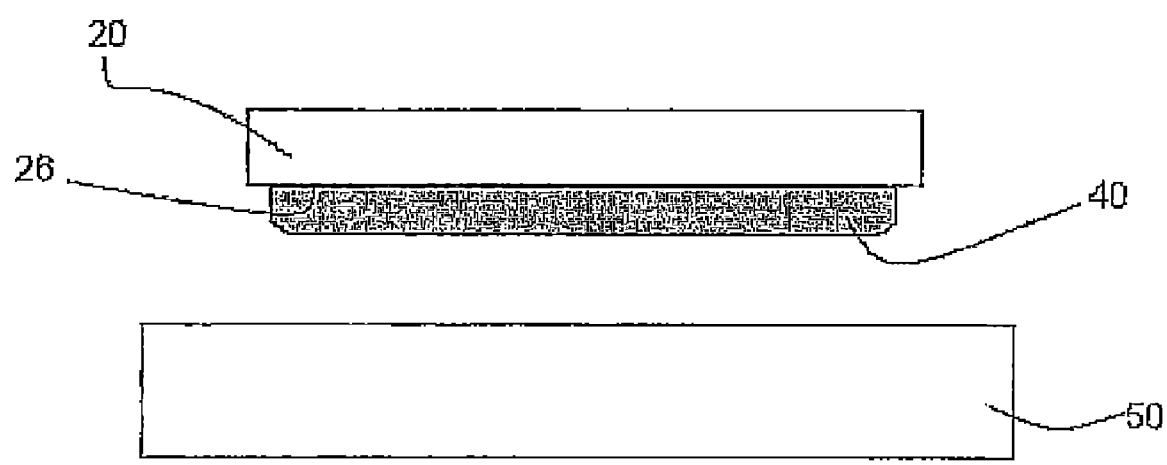
FIG. 1 is a schematic representation of a die including an adhesive composition applied thereon for use in an assembly in an embodiment of the invention.

As used herein, spatial or directional terms, such as "left", "right", "inner", "outer", "above", "below", "top", "bottom", and the like, relate to the invention as it is shown in the FIG. 1. However, it is to be understood that the invention may assume various alternative orientations and, accordingly, such terms are not to be considered as limiting. Further, as used herein, all numbers expressing dimensions, physical characteristics, processing parameters, quantities of ingredients, reaction conditions, and the like, used in the specification and claims are to be understood as being modified in all instances by the term "about". Accordingly, unless indicated to the contrary, the numerical values set forth in the following specification and claims are approximations that may vary depending upon the desired properties sought to be obtained by the present invention. At the very least, and not as an attempt to limit the application of the doctrine of equivalents to the scope of the claims, each numerical value should at least be construed in light of the number of reported significant digits and by applying ordinary rounding techniques. Moreover, all ranges disclosed herein are to be understood to include the beginning and ending range values and to encompass any and all subranges subsumed therein. For example, a stated range of "1 to 10" should be considered to include any and all subranges between (and inclusive of) the minimum value of 1 and the maximum value of 10; that is, all subranges beginning with a minimum value of 1 or more and ending with a maximum value of 10 or less, e.g., 5.5 to 10.

The present invention involves adhesive compositions that are particularly suited for attaching substrates in the micro-electronics industry. As will be discussed in more detail herein, such compositions are particularly useful in die attach applications, and possess excellent properties, particularly with respect to electrical and thermal conductivity, for such applications, while maintaining excellent dispensiblity in traditional dispensing systems.

In one embodiment, the invention is directed to an adhesive composition. The adhesive composition includes a curable resin component, a curing agent for the curable resin component, and a conductive filler material. The filler material is an alloy of silver and copper.

The curable resin component can include any curable resin, and desirably includes a thermosetting material that cures through the addition of energy, such as heat or irradiation. Particularly useful are thermosetting resins that are B-Stageable to form a partial reaction product, in a tackified form. Examples of useful curable resins include epoxies, episulfides, maleimides, itaconimides, nadimides, (meth)acrylates, and combinations thereof. The curable resin should be included in the adhesive composition in an amount between 5 wt % and 95 wt % based on the total weight of the curable resin component.

If the resin component is selected to include an epoxy, any thermosetting epoxy resin may be used which is capable of being partially cured or B-staged, as will be discussed in more detail herein. Particularly desirable are solid epoxy resins and, in particular, tri- or multi-functional epoxy resins. Non-limiting examples of useful epoxy resins include solid epoxy resins derived from bisphenol A, F or S, tetramethyl and/or biphenyl, and epichlorohydrin, novalacs, and the like.

Also particularly desirable are silane-modified epoxies. One such silane-modified epoxy is formed as the reaction product of bisphenol F epoxy and epoxy silane where epoxy silane is embraced by structure I:

where $R^1$ is an oxirane, examples of which include 2-(ethoxymethyl)oxirane, 2-(propoxymethyl)oxirane, 2-(methoxymethyl)oxirane, and 2-(3-methoxypropyl)oxirane and $R^2$ is an alkyl or alkoxy-substituted alkyl, aryl, or aralkyl group having from one to ten carbon atoms. In one embodiment, $R^1$ is 2-(ethoxymethyl)oxirane and $R^2$ is methyl.

In addition to epoxies, episulfides are desirable as well, whether they are full or partial episulfides, provided that they are in the solid state. Episulfides may be commercially available or readily prepared from the corresponding epoxy through known synthetic methods.

Maleimides, nadimides, and itaconimides are also useful as the curable resin, including those compounds having the following structures II, III, and IV, respectively:

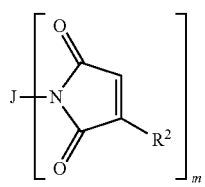

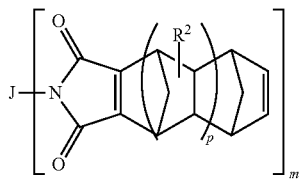

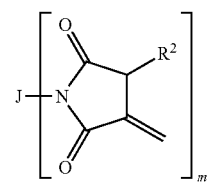

where m can range from 1 to 15, p can range from 0 to 15, each $R^2$ is independently selected from hydrogen or lower alkyl, and J is a monovalent or a polyvalent moiety comprising organic or organosiloxane radicals, and combinations of two or more thereof.

More specific representations of the maleimides, itaconimides and nadimides in the solid state include those corresponding to structures IX, X, or XI, where m ranges from 1 to 6, p is 0, $R^2$ is independently selected from hydrogen or lower alkyl, and J is a monovalent or polyvalent radical selected from hydrocarbyl, substituted hydrocarbyl, heteroatom-containing hydrocarbyl, substituted heteroatom-containing hydrocarbyl, hydrocarbylene, substituted hydrocarbylene, heteroatom-containing hydrocarbylene, substituted heteroatom-containing hydrocarbylene, polysiloxane, polysiloxane-polyurethane block copolymer, and combinations of two or more thereof, optionally containing one or more linkers selected from a covalent bond, —O—, —S—, —NR—, —O—C(O)—, —O—C(O)—O—, —O—C(O)—R—, —NR—C(O)—, —NR—C(O)—O—, —NR—C(O)—NR—, —S—C(O)—, —S—C(O)—O—, —S—C(O)—NR—, —S(O)—, —S(O)$_2$—, —O—S(O)$_2$—, —O—S(O)$_2$—O—, —O—S(O)$_2$—NR—, —O—S(O)—, —O—S(O)—O—, —O—S(O)NR—, —O—NR—C(O)—, —O—NR—C(O)—O—, —O—NR—C(O)—NR—, —NR—O—C(O)—, —NR—O—C(O)—O—, —NR—O—C(O)—NR—, —O—NR—C(S)—, —O—NR—C(S)—O—, —O—NR—C(S)—NR—, —NR—O—C(S)—, —NR—O—C(S)—O—, —NR—O—C(S)—NR—, —O—C(S)—, —O—C(S)—O—, —O—C(S)—NR—, —NR—C(S)—, —NR—C(S)—O—, —NR—C(S)NR—, —S—S(O)$_2$—, —S—S(O)$_2$—O—, —S—S(O)$_2$—NR—, —NR—O—S(O)—, —NR—O—S(O)—O—, —NR—O—S(O)—NR—, —NR—O—S(O)$_2$—, —NR—O—S(O)$_2$—O—, —NR—O—S(O)$_2$—NR—, —O—NR—S(O)—, —O—NR—S(O)—O—, —O—NR—S(O)—NR—, —O—NR—S(O)$_2$—O—, —O—NR—S(O)$_2$—NR—, —O—NR—S(O)$_2$—, —O—P(O)R$_2$O—, —S—P(O)R$_2$—, —NR—P(O)R$_2$—, where each R is independently hydrogen, alkyl or substituted alkyl, and combinations of any two or more thereof.

When one or more of the above described monovalent or polyvalent groups contain one or more of the above described linkers to form the "J" appendage of a maleimide, nadimide or itaconimide group, as readily recognized by those of skill in the art, a wide variety of linkers can be produced, such as, for example, oxyalkyl, thioalkyl, aminoalkyl, carboxylalkyl, oxyalkenyl, thioalkenyl, aminoalkenyl, carboxyalkenyl, oxyalkynyl, thioalkynyl, aminoallcynyl, carboxyallynyl, oxycycloalkyl, thiocycloalkyl, aminocycloallcyl, carboxycycloalkyl, oxycloalkenyl, thiocycloalkenyl, aminocycloalkenyl, carboxycycloalkenyl, heterocyclic, oxyheterocyclic, thioheterocyclic, aminoheterocyclic, carboxyheterocyclic, oxyaryl, thioaryl, aminoaryl, carboxyaryl, heteroaryl, oxyheteroaryl, thioheteroaryl, aminoheteroaryl, carboxyheteroaryl, oxyalkylaryl, thioalkylaryl, aminoalkylaryl, carboxyalkylaryl, oxyarylalkyl, thioarylalkyl, aminoarylalkyl, carboxyarylalkyl, oxyarylallcenyl, thioarylallcenyl, aminoarylalkenyl, carboxyarylalkenyl, oxyalkenylaryl, thioalkenylaryl, aminoalkenylaryl, carboxyalkenylaryl, oxyarylalkynyl, thioarylalkynyl, aminoarylalkynyl, carboxyarylalkynyl, oxyalkynylaryl, thioallynylaryl, aminoalkynylaryl or carboxyalkynylaryl, oxyalkylene, thioalkylene, aminoalkylene, carboxyallylene, oxyalkenylene, thioalkenylene, aminoalkenylene, carboxyalkenylene, oxyalkynylene, thioalkynylene, aminoalkynylene, carboxyalkynylene, oxycycloalkylene, thiocycloalkylene, aminocycloallylene, carboxycycloalkylene, oxycycloalkenylene, thiocycloalkenylene, aminocycloalkenylene, carboxycycloalkenylene, oxyarylene, thioarylene, aminoarylene, carboxyarylene, oxyalkylarylene, thioalkylarylene, aminoalkylarylene, carboxyalkylarylene, oxyarylalkylene, thioarylallylene, aminoarylalkylene, carboxyarylalkylene, oxyarylalkenylene, thioarylalkenylene, amino arylalkenylene, carboxyarylalkenylene, oxyalkenylarylene, thioallcenylarylene, aminoalkenylarylene, carboxyalkenylarylene, oxyarylalkynylene, thioarylallynylene, aminoarylalkynylene, carboxy arylallynylene, oxyalkynylarylene, thioalkynylarylene, aminoalkynylarylene, carboxyalkynylarylene, heteroarylene, oxyheteroarylene, thioheteroarylene, aminoheteroarylene, carboxyheteroarylene, heteroatom-containing di- or polyvalent cyclic moiety, oxyheteroatom-containing di- or polyvalent cyclic moiety, thioheteroatom-containing di- or polyvalent cyclic moiety, aminoheteroatom-containing di- or polyvalent cyclic moiety, carboxyheteroatom-containing di- or polyvalent cyclic moiety, disulfide, sulfonamide, and the like.

In another embodiment, maleimides, nadimides, and itaconimides contemplated for use in the practice of the present invention have the structures IX, X, or XI, where m ranges from 1 to 6, p ranges between 0 and 6, and J is selected from:

saturated straight chain alkyl or branched chain alkyl, optionally containing optionally substituted aryl moieties as substituents on the alkyl chain or as part of the backbone of the alkyl chain, and where the alkyl chains have up to about 20 carbon atoms;

a siloxane having the structure —$(C(R^3)_2)_d$—$[Si(R^4)_2$—$O]_f$—$Si(R^4)_2$—$(C(R^3)_2)_e$—, —$(C(R^3)_2)_d$—$C(R^3)$—$C(O)O$—$(C(R^3)_2)_d$—$[Si(R^4)_2$—$O]_f$—$Si(R^4)_2(C(R^3)_2)_e$—$O(O)C$—$(C(R^3)_2)_e$—, or —$(C(R^3)_2)_d$—$C(R^3)$—$O(O)C$—$(C(R^3)_2)_d$—$[Si(R^4)_2$—$O]_f$—$Si(R^4)_2$—$(C(R^3)_2)_e$—$C(O)O$—$(C(R^3)_2)_e$—, where each $R^3$ is independently hydrogen, alkyl or substituted alkyl, each $R^4$ is independently hydrogen, lower alkyl or aryl, d ranges from 1 to 10, e ranges between 1 and 10, and f ranges from 1 to 50;

a polyalkylene oxide having the structure:

$$[(CR_2)_r\text{—}O\text{—}]_f\text{—}(CR_2)_s\text{—} \tag{V}$$

where each R is independently hydrogen, alkyl or substituted alkyl, r is between 1 and 10, s is between 1 and 10, and f ranges from 1 to 50;

aromatic groups having the structure:

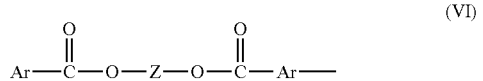

(VI)

where each Ar is a monosubstituted, disubstituted, or trisubstituted aromatic or heteroaromatic ring having in the range of 3 up to 10 carbon atoms, and Z is saturated straight chain alkylene or branched chain alkylene, optionally containing saturated cyclic moieties as substituents on the alkylene chain or as part of the backbone of the alkylene chain; polyalkylene oxides having the structure:

$$\text{—}[(CR_2)_r\text{—}O\text{—}]_q\text{—}(CR_2)_s\text{—} \tag{VII}$$

where each R is independently hydrogen, alkyl, or substituted alkyl, r is between 1 and 10, s is between 1 and 10, and q falls in the range of 1 up to 50;

di- or tri-substituted aromatic moieties having the structure:

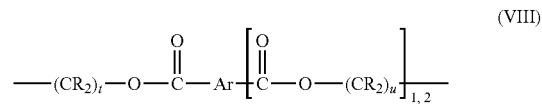

(VIII)

where each R is independently hydrogen, alkyl, or substituted alkyl, t falls in the range of 2 up to 10, u falls in the range of 2 up to 10, and Ar is a monosubstituted, disubstituted, or trisubstituted aromatic or heteroaromatic ring having in the range of 3 up to 10 carbon atoms; aromatic groups having the structures:

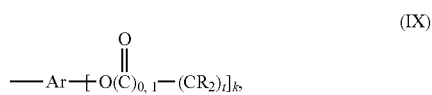

(IX)

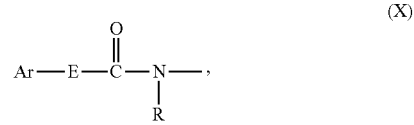

(X)

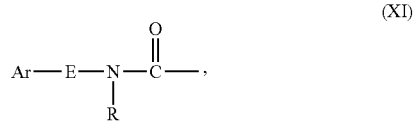

(XI)

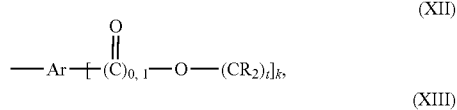

(XII)

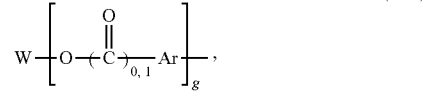

(XIII)

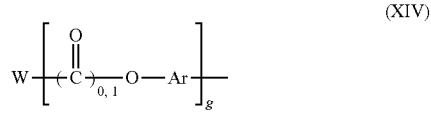

(XIV)

where each R is independently hydrogen, alkyl, or substituted alkyl, t is from 2 to 10, k is 1, 2, or 3, g ranges from 1 up to about 50, each Ar is as defined above, E is —O— or —$NR^5$— where $R^5$ is hydrogen or lower alkyl, and W is straight or branched chain alkyl, alkylene, oxyalkylene, ester, or polyester, a siloxane having the structure —$(C(R^3)_2)_d$—$[Si(R^4)_2$—$O]_f$—$Si(R^4)_2$—$(C(R^3)_2)_e$—, —$(C(R^3)_2)_d$—$C(R^3)$—$C(O)O$—$(C(R^3)_2)_d$—$[Si(R^4)_2$—$O]_f$—$Si(R^4)_2$—$(C(R^3)_2)_e$—$O(O)C$—$(C(R^3)_2)_e$—, or —$(C(R^3)_2)_d$—$C(R^3)$—$O(O)C$—$(C(R^3)_2)_d$—$[Si(R^4)_2$—$O]_f$—$Si(R^4)_2$—$(C(R^3)_2)_e$—$C(O)O$—$(C $(R^3)_2)_e$—, where each $R^3$ is independently hydrogen, alkyl, or substituted alkyl, each $R^4$ is independently hydrogen, lower alkyl, or substituted aryl, d and e are each from 1 to 10, and f is from 1 to 50;

a polyalkylene oxide having the structure:

$$—[(CR_2)_r—O—]_f—(CR_2)_s— \quad (XV)$$

where each R is independently hydrogen, alkyl, or substituted alkyl, r and s each range from 1 to 10, and f is from 1 to 50, optionally containing substituents selected from hydroxy, alkoxy, carboxy, nitrile, cycloalkyl, or cycloalkenyl;

a urethane group having the structure:

$$R^7U—C(O)—NR^6—R^8—NR^6—C(O)—(O—R^8—O—C(O)NR^6—R^8—NR^6—C(O))_v—U—R^8 \quad (XVI)$$

where each $R^6$ is independently hydrogen or lower alkyl, each $R^7$ is independently an alkyl, aryl, or arylalkyl group having 1 to 18 carbon atoms, each $R^8$ is an alkyl or alkyloxy chain having up to about 100 atoms in the chain, optionally substituted with Ar, U is —O—, —S—, —N(R)—, or —P(L)$_{1,2}$—, where R is as defined above, and where each L is independently =O, =S, —OR, or —R, and v ranges from 0 to 50;

polycyclic alkenyl; or mixtures of any two or more thereof.

Particularly desirable maleimide compounds for use in the present invention include, for example, maleimides having the following structures:

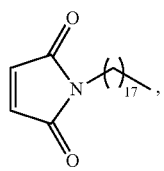

(XVII)

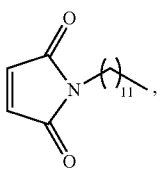

(XVIII)

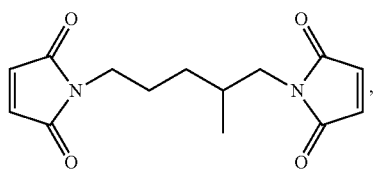

(XIX)

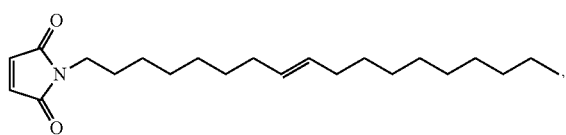

(XX)

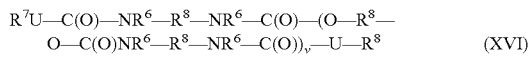

(XXI)

and

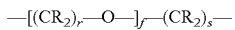

(XXII)

Other useful maleimide resins also include stearyl maleimide, oleyl maleimide and behenyl maleimide, 1,20-bismaleimido-10,11-dioctyl-eicosane, and the like, as well as combinations thereof. Other maleimides suitable for use herein include those disclosed in U.S. Pat. Nos. 6,034,194 (Dershem) and 6,521,731 (Dershem), the disclosures of which are expressly incorporated herein by reference.

(Meth)acrylates, useful as the curable resin, may be chosen from a host of different compounds. As used herein, the terms (meth)acrylic and (meth)acrylate are used synonymously with regard to the monomer and monomer-containing component. The terms (meth)acrylic and (meth)acrylate include acrylic, (meth)acrylic, acrylate, and (meth)acrylate.

The (meth)acrylate component may comprise one or more members selected from a monomer represented by the formula:

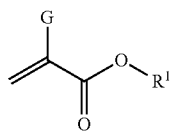

(XXIII)

where G is hydrogen, halogen, or an alkyl having from 1 to 4 carbon atoms, $R^1$ has from 1 to 16 carbon atoms and is an alkyl, cycloalkyl, alkenyl, cycloalkenyl, alkaryl, aralkyl, or aryl group, optionally substituted or interrupted with silane, silicon, oxygen, halogen, carbonyl, hydroxyl, ester, carboxylic acid, urea, urethane, carbamate, amine, amide, sulfur, sulfonate, or sulfone; urethane acrylates or ureide acrylates represented by the formula:

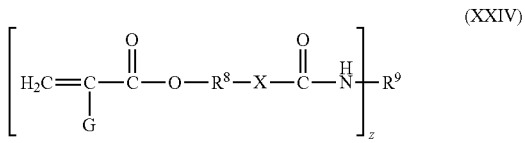

where G is hydrogen, halogen, or an alkyl having from 1 to 4 carbon atoms, $R^8$ denotes a divalent aliphatic, cycloaliphatic, aromatic, or araliphatic group, bound through a carbon atom or carbon atoms thereof indicated at the —O— atom and —X— atom or group, X is —O—, —NH—, or —N(alkyl)—, in which the alkyl radical has from 1 to S carbon atoms, z is 2 to 6, and $R^9$ is a z-valent cycloaliphatic, aromatic, or araliphatic group bound through a carbon atom or carbon atoms thereof to the one or more NH groups; and a di- or tri(meth)acrylate selected from polyethylene glycol di(meth)acrylates, bisphenol-A di(meth)acrylates, tetrahydrofurane di(meth)acrylates, hexanediol di(meth)acrylate, trimethylol propane tri(meth)acrylate, or combinations thereof.

Suitable polymerizable (meth)acrylate monomers include triethylene glycol di(meth)acrylate, tripropylene glycol di(meth)acrylate, tetraethylene glycol di(meth)acrylate, diethylene glycol di(meth)acrylate, 1,4-butanediol di(meth)acrylate, 1,6-hexanediol di(meth)acrylate, pentaerythritol tetra(meth)acrylate, trimethylol propane tri(meth)acrylate, di-pentaerythritol monohydroxypenta(meth)acrylate, pentaerythritol tri(meth)acrylate, bisphenol-A-ethoxylate di(meth)acrylate, trimethylolpropane ethoxylate tri(meth)acrylate, trimethyloipropane propoxylate tri(meth)acrylate, and bisphenol-A-diepoxide di(meth)acrylate.

Additionally, mono-functional (meth)acrylate monomers may be used, including tetrahydrofurane (meth)acrylates and di(meth)acrylates, citronellyl (meth)acrylate, hydroxypropyl (meth)acrylate, tetrahydrodicyclopentadienyl (meth)acrylate, triethylene glycol (meth)acrylate, triethylene glycol (meth)acrylate, and combinations thereof.

Of course, (meth)acrylated silicones may also be used, provided the silicone backbone is not so large so as to minimize the effect of (meth)acrylate when cure occurs.

Other (meth)acrylates suitable for use herein include the low viscosity acrylates disclosed in U.S. Pat. No. 6,211,320 (Dershem), the disclosure of which is expressly incorporated herein by reference.

The adhesive composition also includes a curing agent, such as a heat cure catalyst or a radiation cure photoinitiator. The curing agent should be included in the adhesive composition in an amount between 1 wt % and 3 wt % based on the total weight of the curable resin component.

The heat cure catalyst may be included in the composition to reduce the temperature at which cure occurs or hasten the degree of cure when the appropriate temperature condition is selected for cure to occur. The heat cure catalyst may be chosen from free radical catalysts, anionic curatives, cationic curatives, and combinations thereof. For instance, the free radical catalyst may be chosen from peroxides, azo compounds, and combinations thereof. Particularly desirable peroxide catalysts include dicumyl peroxide, dibenzoyl peroxide, 2-butanone peroxide, tert-butyl perbenzoate, di-tert-butyl peroxide, 2,5-bis(tert-butylperoxy)-2,5-dimethylhexane, bis(tert-butyl peroxyisopropyl)benzene, and tert-butyl hydroperoxide, and azo compounds include 2,2'-azobis(2-methylpropanenitrile), 2,2'-azobis(2-methylbutanenitrile), and 1,1'-azobis(cyclohexanecarbonitrile).

Commercially available examples of these free radical catalysts include those promoted by Akzo Nobel, such as the following peroxides dl-isobutyryl peroxide (CAS No. 3437-84-1), cumyl peroxyneodecanoate (CAS No. 26748-47-0), peroxydicarbonate mixture (CAS No. 105-64-6; 19910-65-7; 78350-78-4), 2,4,2-trimethylpentyl-2 peroxyneodecanoate (CAS No. 51240-95-0), cumyl peroxyneoheptanoate (CAS No. 68299-16-1), di-sec-butyl peroxydicarbonate (CAS No. 19910-65-7), tert-butylperoxyneodecanoate (CAS No. 26748-41-4), dibutyl peroxydicarbonate (CAS No. 16215-49-9), dicetyl peroxydicarbonate (CAS No. 26332-14-5), di(4-tert-butylcyclohexyl) peroxydicarbonate (CAS No. 15520-11-3), di(2-ethylhexyl) peroxydicarbonate (CAS No. 16111-62-9), dimyristyl peroxydicarbonate (CAS No. 53220-22-7), tert-butyl peroxyneoheptanoate (CAS No. 26748-38-9), tert-amyl peroxypivalate (CAS No. 29240-17-3), tert-butyl peroxypivalate (CAS No. 927-07-1), di-(3,5,5-trimethylhexanoyl) peroxide (CAS No. 3851-87-4), dilauroyl peroxide (CAS No. 105-74-8), dioctanoyl peroxide (CAS No. 762-16-3), didecanoyl peroxide (CAS No. 762-12-9), 2,5-dimethyl-2,5-di(2-ethylhexanoylperoxy)hexane (CAS No. 13052-09-0), tert-amyl peroxy-2-ethylhexanoate (CAS No. 686-31-7), tert-butyl peroxy-2-ethylhexanoate (CAS No. 3006-82-4), dibenzoyl peroxide (CAS No. 94-36-0), 1,1-di (tert-butylperoxy)-3,3,5-trimethylcyclohexane (CAS No. 6731-36-8), 2,2-bis[4,4-di-(tertbutyl-peroxy-cyclohexyl) propane] (CAS No. 1705-60-8), 1,1-di(tert-amylperoxy)cyclohexane (CAS No. 15667-10-4), 1,1-di(tert-butylperoxy) cyclohexane (CAS No. 3006-86-8), tert-amyl peroxy 2-ethylhexyl carbonate (CAS No. 70833-40-8), tert-butyl peroxy-3,5,5-trimethylhexanoate (CAS No. 13122-18-4), tert-butyl peroxy-2-methylbenzoate (CAS No. 22313-62-8) 2,2-di-(tert-butylperoxy)butane (CAS No. 2167-23-9), tert-butyl peroxy isopropyl carbonate (CAS No. 2372-21-6), tert-butyl peroxy 2-ethylhexyl carbonate (CAS No. 34443-12-4), tert-amyl peroxybenzoate (CAS No. 4511-39-1), tert-butyl peroxyacetate (CAS No. 107-71-1), butyl 4,4-di-(tert-butylperoxy)valerate (CAS No. 995-33-5), tert-butyl peroxybenzoate (CAS No. 614-45-9), di-tert-amyl peroxide (CAS No. 10508-09-5), dicumyl peroxide (CAS No. 80-43-3), di-(tert-butylperoxyisopropyl)benzene (CAS No. 25155-25-3), 2,5-dimethyl-2,5-di(tert-butylperoxy)hexane (CAS No. 78-63-7), tert-butyl cumyl peroxide (CAS No. 3457-61-2), 2,5-dimethyl-2,5-di(tertbutylperoxy)hexyne-3 (CAS No. 1068-27-5), di-tert-butyl peroxide (CAS No. 110-05-4), 3,6,9-triethyl-3,6,9-trimethyl-1,4,7-triperoxonane (CAS No. 24748-23-0), 1,1,3,3-tetramethylbutyl hydroperoxide (CAS No. 5809-08-5), diisopropylbenzene monohydroperoxide (CAS No. 26762-93-6), cumyl hydroperoxide (CAS No. 80-15-9), tert-butyl hydroperoxide (CAS No. 75-91-2), and tert-amyl hydroperoxide (CAS No. 3425-61-4), and the following azo compounds 2,2'-azobis(isobutyronitrile) (CAS No. 78-67-1), 2,2'-azobis(2-methylbutyronitrile) (CAS No. 13472-08-7), and 1,1' azobis(1-cyclohexanenitrile) (CAS No. 2094-98-6).

The heat cure catalyst may also be an anionic curative, such as those broadly described as aza compounds, amine compounds, amide compounds, imidazole compounds, and combinations thereof. More specific examples of aza compounds include:

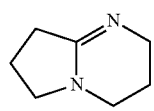

1,5-Diazabicyclo[4.3.0]non-5-ene

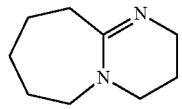

1,8-Diazabicyclo[5.4.0]undec-5-ene ("DBU")

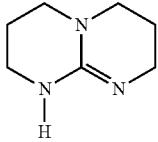

1,5,7-Triazabicyclo[4.4.0]dec-5-ene

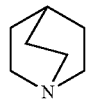

Quinuclidine

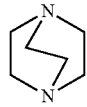

1,4-Diazabicyclo[2.2.2]octane

More specific examples of amine compounds include aliphatic polyamines, aromatic polyamines, alicyclic polyamines, such as diethylenetriamine, triethylenetetraamine, diethylaminopropylamine, benzyl dimethylamine, m-xylenediamine, diaminodiphenylamine, quinoxaline, isophoronediamine, menthenediamine, and combinations thereof.

A more specific example of an amide compound is the functionalized amide, dicyandiamide.

More specific examples of imidazole compounds include isoimidazole, imidazole, 2-ethyl-4-methylimidazole, 2,4-dimethylimidazole, butylimidazole, 2-heptadecenyl-4-methylimidazole, 2-methylimidazole, 2-undecenylimidazole, 1-vinyl-2-methylimidazole, 2-undecyl imi dazole, 2-heptadecylimidazole, 2-phenylimidazole, 1-benzyl-2-methylimidazole, 1-propyl-2-methylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-guanaminoethyl-2-methylimidazole, addition products of an imidazole and methylimidazole, addition products of an imidazole and trimellitic acid, 2-n-heptadecyl-4-methylimidazole, phenylimidazole, benzylimidazole, 2-methyl-4,5-diphenylimidazole, 2,3,5-triphenylimidazole, 2-styrylimidazole, 1-(dodecyl benzyl)-2-methylimidazole, 2-(2-hydroxyl-4-t-butylphenyl)-4,5-diphenylimidazole, 2-(2-methoxyphenyl)-4,5-diphenylimidazole, 2-(3-hydroxyphenyl)-4,5-diphenylimidazole, 2-(p-dimethylaminophenyl)-4,5-diphenylimidazole, 2-(2-hydroxyphenyl)-4,5-diphenylimidazole, di(4,5-diphenyl-2-imidazole)-benzene-1,4,2-naphthyl-4,5-diphenylimidazole-, 1-benzyl-2-methylimidazole, 2-p-methoxystyrylimidazole, and combinations thereof.

The heat cure catalyst may also be a cationic curative, such as those broadly described as organic acids, anhydrides, and Lewis acids. The organic acids include phenols, thiophenols, thiols, carboxylic acids, and combinations thereof. The anhydrides include among others hexahydrophthalic anhydride, methyl hexahydrophthalic anhydride, 5-(2,5-clioxotetrahydrol)-3-methyl-3-cyclohexene-1,2-dicarboxylic anhydride, and combinations thereof. The Lewis acids include a variety of materials known in the art as Lewis acids, examples of which are phosphines, alkyl halides, phosphorous esters, boron trifluoride etherate and the like.

In the event that it is desirable for certain commercial applications to cure the resin component by exposure to radiation in the electromagnetic spectrum, a photoinitiator should also be included in the composition. The photoinitiator should be chosen with an eye toward the range of radiation in the electromagnetic spectrum at which cure is to be triggered. For instance, suitable ranges of radiation in the electromagnetic spectrum include UV, UV/VIS, VIS, IR, E-beam, X-ray, and microwave radiation.

Representative examples of UV and UV/VIS photoinitiators include those available commercially from Ciba Specialty Chemicals, Tarrytown, N.Y. under the "IRGACURE" and "DAROCUR" tradenames, specifically "IRGACURE" 184 (1-hydroxycyclohexyl phenyl ketone), 907 (2-methyl-1-[4-(methylthio)phenyl]-2-morpholino propan-1-one), 369 (2-benzyl-2-N,N-dimethylamino-1-(4-morpholinophenyl)-1-butanone), 500 (the combination of 1-hydroxy cyclohexyl phenyl ketone and benzophenone), 651 (2,2-dimethoxy-2-phenyl acetophenone), 1700 (the combination of bis(2,6-dimethoxybenzoyl-2,4,4-trimethyl pentyl) phosphine oxide and 2-hydroxy-2-methyl-1-phenyl-propan-1-one), and 819 [bis(2,4,6-trimethyl benzoyl) phenyl phosphine oxide] and "DAROCUR" 1173 (2-hydroxy-2-methyl-1-phenyl-1-propane) and 4265 (the combination of 2,4,6-trimethylbenzoyl-diphenyl-phosphine oxide and 2-hydroxy-2-methyl-1-phenyl-propan-1-one); and the visible light [blue] photoinitiators, dl-camphorquinone and "IRGACURE" 784DC. Of course, combinations of these materials may also be employed herein.

Other photoinitiators useful herein include alkyl pyruvates, such as methyl, ethyl, propyl, and butyl pyruvates, and aryl pyruvates, such as phenyl, benzyl, and appropriately substituted derivatives thereof.

Photoinitiators particularly well-suited for use herein include ultraviolet photoinitiators, such as 2,2-dimethoxy-2-phenyl acetophenone (e.g., "IRGACURE" 651), and 2-hydroxy-2-methyl-1-phenyl-1-propane ethyl-1-phenyl-1-propane (e.g., "DAROCUR" 1173), bis(2,4,6-trimethyl benzoyl) phenyl phosphine oxide (e.g., "IRGACURE" 819), and the ultraviolet/visible photoinitiator combination of bis(2,6-dimethoxybenzoyl-2,4,4-trimethylpentyl)phosphine oxide and 2-hydroxy-2-methyl-1-phenyl-propan-1-one (e.g., "IRGACURE" 1700), as well as the visible photoinitiator bis([5-2,4-cyclopentadien-1-yl)-bis[2,6-di fluoro-3-(1H-pyrrol-1-yl)phenyl]titanium (e.g., "IRGACURE" 784DC).

Additional photoinitiators may be chosen from those available from Sartomer, Inc., Exton, Pa. under the tradenames "ESACURE" and "SARCAT". Examples include "ESACURE" KB1 (benzil dimethyl ketal), "ESACURE" EB3 (mixture of benzoin and butyl ethers), "ESACURE" TZT (trimethylbenzophenone blend), "ESACURE" KIP100F (hydroxy ketone), "ESACURE" KIP150 (polymeric hydroxy ketone), "ESACURE" KT37 (blend of "ESACURE" TZT and KIP150), "ESACURE" KT046 (blend of triphenyl phosphine oxide, "ESACURE" KIP150 and TZT), and "ESACURE" X33 [blend of 2- and 4-isopropylthioxanthone, ethyl 4-(dimethyl amino) benzoate and "ESACURE" TZT].

Of course, combinations of such photoinitiators may be used as deemed appropriate by those of ordinary skill in the art.

In addition, the photoinitiator may be a cationic one, which is capable of catalyzing the polymerization of the inventive compositions upon exposure to appropriate radiation conditions. Desirable cationic photoinitiators for use with the present invention include triarylsulfonium and diaryliodonium salts containing non-nucleophilic counterions and aryl diazonium salts, examples of which include 4-methoxybenzenediazonium hexafluorophosphate, benzenediazonium tetrafluoroborate, diphenyl iodonium chloride, diphenyl iodonium hexafluorophosphate, 4,4-dioctyloxydiphenyl iodonium hexafluorophosphate, triphenylsulfonium tetrafluoroborate, diphenyltolylsulfonium hexafluorophosphate, phenylditolylsulfonium hexafluoroarsenate, and diphenyl-thiophenoxyphenylsulfonium hexafluoroantimonate, and those commercially available from Sartomer, such as "SARCAT" CD 1010 [triaryl sulfonium hexafluoroantimonate (50% in propylene carbonate)], "SARCAT" DC 1011 [triaryl sulfonium hexafluorophosphate (50% n-propylene carbonate)], "SARCAT" DC 1012 (diaryl iodonium hexafluoroantimonate), and "SARCAT" K185 [triaryl sulfonium hexafluorophosphate (50% in propylene carbonate)].

The adhesive composition also includes a conductive filler material which provides the composition with thermal conductivity and is known to incorporate conductive fillers into adhesive compositions, particularly in the micro-electronics industry. Traditionally, such adhesive compositions incorporate metals such as silver as a conductive filler, due to its ability to impart thermal conductivity to the composition. However, such metals, particularly when used in higher volumes, can affect the viscosity and flow properties of the composition, and therefore can have a deleterious effect on the dispensability of the adhesive composition.

The "dispensability" of a composition, as used herein, is concerned with the ease and speed with which a composition can be applied to successive points on a surface. Generally, an adhesive composition will be in a near solid state at equilibrium. Upon applying shear stress, the adhesive will shear-thin and flow, which allows it to be applied more readily onto a surface. Once the composition is applied to the surface and the shearing stress has ceased, it will begin returning to the equilibrium state. With adhesives, the composition is generally stored in a dispenser container such as a tube where it attains equilibrium behaving like a solid. The adhesive undergoes shear thinning by, for example, forcing the adhesive through an opening in the dispenser. One example of such a dispenser is a syringe with a small aperture in the tip. Forcing the adhesive through the aperture provides sufficient shearing force to thin the adhesive. Once the adhesive has exited the dispenser, however, it will no longer be subjected to the shearing forces and will begin to return to solid-state equilibrium. One result of this return to equilibrium is the formation of residual strands or "tails" of adhesive material that form when the dispenser is retracted after an adhesive has been applied to a surface, an effect also known as "stringing." These tails are generally caused by the failure of the dispensed portion of the adhesive to break away from the adhesive remaining in the dispenser or a portion of the dispenser itself. The presence of a tail impedes the ability of the same dispenser to quickly and cleanly apply "dots" of adhesive at multiple, distinct points on a surface. Adhesive tails can cause contamination of the surface and poor bonds. Such dispensability is particularly important in assembly of micro-electronics, where large scale processing requires fast, clean release of adhesives from the dispensing equipment. If the amount of adhesive applied at a specific location is insufficient, the bond formed from at that location may be undesirably weak. To the contrary, if the amount of adhesive applied at a specific location is too high, the resulting bond may be too wide or spreading may occur.

It has been discovered through the present invention that specific alloys are useful as conductive filler materials, providing adhesive compositions with effective electrical and thermal conductivity while maintaining excellent dispensability. Conductive filler materials useful in the composition of the present invention are alloys of silver and copper.

Copper is not known to be particularly useful as a filler material in adhesive compositions in that it provides very poor thermal conductivity due at least in part to oxidation of the copper within the composition and/or during processing thereof, which can further result in corrosion of the assembly when the adhesive composition is applied to a substrate. While silver materials are commonly used as fillers for conductive adhesives, silver is an expensive filler material, and increasing the level of silver to provide better conductivity can be expensive, and lead to a deleterious effect on the dispensability of the composition. It has been discovered through the present invention that certain alloys of copper and silver are particularly useful as conductive fillers for adhesive compositions and thermal conductivity to the compositions, while also imparting effective dispensability.

The ratio of the different elements in the alloy can be modified in order to produce alloys of varying characteristics. For example, an alloy of copper and sliver can contain in the range of about 10 wt % to about 85 wt %, such as about 45 wt % to about 65 wt %, copper based on the total weight of the alloy. An alloy may contain in the range of about 15% to about 90%, such as about 35% to about 55%, by weight silver atoms based on the total weight of the alloy. In one embodiment, the alloy of the inventive composition includes 80 wt % by weight copper and 20 wt % by weight silver based on the total weight of the alloy. In another embodiment, the inventive composition includes an alloy comprised of 50 wt % copper and 50 wt % silver based on the total weight of the alloy. Examples of commercially available silver/copper alloys include AACU-3001, commercially available from Metalor Technologies of Attleboro, Mass.

The silver/copper alloy has a tap density between about 2 and about 8 g/cm$^3$ and a mean particle size of between about 1 and about 20 µm to achieve a bondline of 25 µm. These fillers are also characterized by their surface area, such as between about 0.1 and about 5 m$^2$/g, and weight loss at high temperatures, for example, at 110° C. or 538° C. Filler particles are obtained in various morphologies such as flakes, spheres, powders, or porous. In typical adhesives, filler particles of multiple morphologies might be present.

The alloy of the filler material may comprise in the range of about 45 wt % up to about 90 wt %, such as about 75 wt % up to about 85 wt %, by weight based on the total weight of the adhesive composition.

Optionally, the filler material may further comprise elemental silver. The elemental silver, when present, may be used in an amount of about 5% to about 50% by weight of the composition.

The adhesive composition may additionally contain a coupling agent. As employed herein, the term "coupling agent" refers to chemical species which contain one set of functional groups capable of bonding to mineral and/or organic surfaces and which also contain another set of reactive functional groups capable of bonding to the reactive materials in the die attach adhesive material. Coupling agents thus facilitate linkage of the die attach material to the substrate to which it is applied.

Exemplary coupling agents contemplated for use in the practice of the present invention include silicate esters, metal acrylate salts (e.g., aluminum methacrylate), titanates (e.g., titanium methacryloxyethylacetoacetate triisopropoxide), or compounds that contain a copolymerizable group and a chelating ligand (e.g., phosphine, mercaptan, acetoacetate, and the like). Generally in the range of about 0.1 wt % up to 10 wt % of at least one coupling agent (based on the total weight of the organic phase) will be employed, with the range of about 0.5 wt % up to 2 wt % being desirable.

Certain desirable coupling agents contain both a co-polymerizable function (e.g., vinyl moiety, acrylate moiety, methacrylate moiety, styrene moiety, cyclopentadiene moiety, and the like), as well as a silicate ester function. The silicate ester portion of the coupling agent is capable of condensing with metal hydroxides present on the mineral surface of the substrate, while the co-polymerizable function is capable of co-polymerizing with the other reactive components of invention adhesive composition. An example of such a coupling agent is an oligomeric silicate coupling agent, such as poly(methoxyvinylsiloxane).

Optionally, an additional filler may be used that is neither electrically nor thermally conductive. Such fillers may be desirable to impart some other property to the formulation such as, for example, reduced thermal expansion of the cured composition, reduced dielectric constant, improved toughness, increased hydrophobicity, viscosity, and the like. Examples of such fillers include perfluorinated hydrocarbon polymers (i.e., TEFLON), thermoplastic polymers, thermoplastic elastomers, mica, fused silica, glass powder, spacer elements, polymethyl (meth)acrylate powder, polyamide powder, polymethylsilsesquioxane powder, and the like.

Examples of suitable elastomers that can be added to the adhesive composition include acrylic rubbers, butadiene/acrylonitrile rubber, styrene/butadiene rubber, polybutadiene rubber, bursa rubber, polyisobutylene, polyisoprene, natural rubber, polyurethane, ethylene-vinyl acetate polymers, ethylene acrylate rubbers, fluorinated rubbers, isoprene-acrylonitrile polymers, chlorosulfonated polyethylenes, and homopolymers of polyvinyl acetate.

The adhesive composition may further contain other additives, such as defoaming agents, leveling agents, dyes, and pigments.

Figure 2:
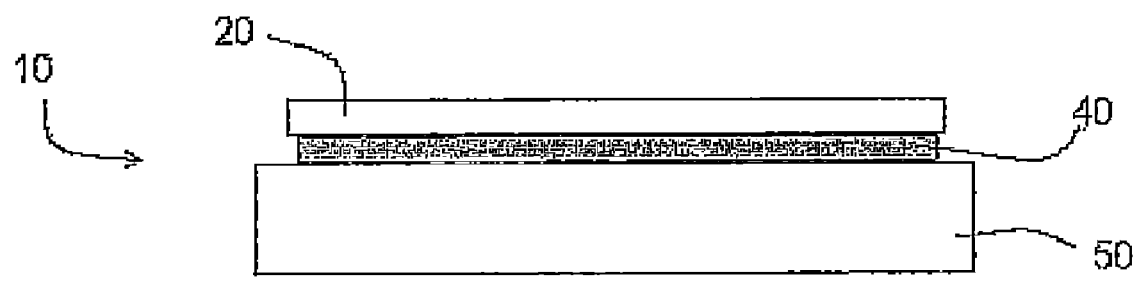
FIG. 2 is a schematic representation of an assembly including a die attached to a substrate in an embodiment of the invention.

Referring to the drawings in which like reference characters refer to like parts throughout the several views thereof, a non-limiting example of an assembly 10 formed using the adhesive compositions of the instant invention is depicted in FIG. 2. Generally speaking, assembly 10 includes a die 20, an adhesive layer 40, and a substrate 50.

As Seen in FIG. 1 the Adhesive Composition May be Applied to the Backside Surface 26 of a die 20 or a pre-diced wafer by syringe dispense, pin transfer, stencil printing, screen printing, spray coating, or other known application methods.

Figure 3:
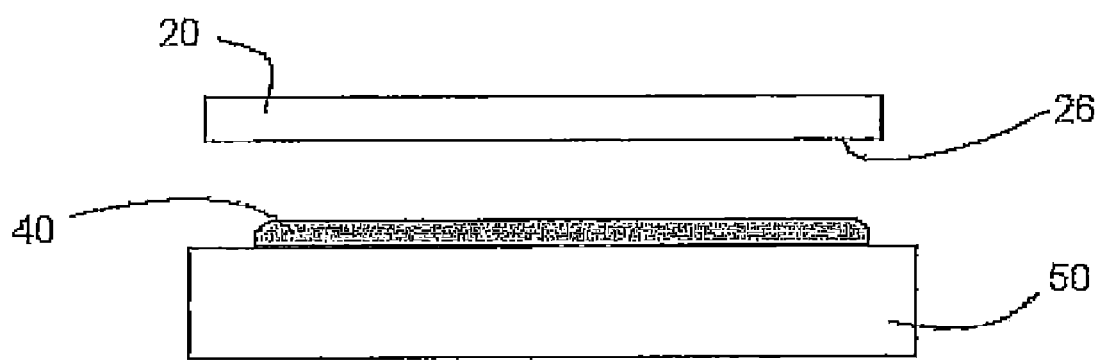
FIG. 3 is a schematic representation of a substrate surface including an adhesive composition applied thereon for use in an assembly in a further embodiment of the invention.

Alternatively, as seen in FIG. 3, the adhesive composition may be applied to a substrate 50, such as a laminate, ceramic, lead frame, heat slug or heat spreader by syringe dispense, pin transfer, stencil printing, screen printing, spray coating, jetting, or other known application methods. Also, the adhesive composition may be applied to an intermediate substrate, such as a wafer dicing tape or film, a wafer supporting tape or film, which is used to transport the adhesive composition pre-applied on the tape or film for transfer onto the die or other substrate (not shown).

In the case of syringe dispense, the adhesive composition can be applied as a series of dots, in a single x-pattern or double x-pattern, at preset intervals across the face of a pre-diced wafer or other substrate. The size of the dots is typically determined by the opening of the aperture in the syringe used for dispensing. After dispensing a dot at a specific location, the syringe retracts and resets itself so it can dispense adhesive at another location on the surface.

In the case of pin transfer, an array of pins are dipped into a tray of the adhesive composition and then the adhesive material that is suspended on the individual pins is dropped onto a pre-diced wafer or other surface.

In the case of stencil printing or screen printing onto pre-diced wafers, the stencil or screen is made with apertures designed to at least partially coat the wafer in a pre-determined manner based on the pattern of the stencil or screen. Specifically, the webbing of the stencil or screen is used to maintain the adhesive composition in place. That is, it is undesirable for the adhesive composition to enter into the dicing streets, which would facilitate die separation during die placement. The width of the webbing, or conversely, the dimensions of the aperture, are designed so that after die placement, the target wet bondline may be achieved and the adhesive composition may form fillets of the desired height beneath the die.

In the case of stencil printing or screen printing onto laminate substrates, the stencil or screen is made with apertures designed to partially coat the die pad. Specifically, the webbing of the screen or stencil is used to maintain in place the die attach adhesive material after die placement. The width of the webbing, or conversely, the dimensions of the aperture, are designed so that after die placement, the target wet bondline may be achieved and the adhesive composition may form fillets of the desired height beneath the die with minimal to no wetting by the adhesive composition of any electrically conductive interconnects that may be present on the laminate.

In the case of application onto laminate substrates, a "zero gap bondline" may be achieved with the adhesive composition. For instance, the laminate is first manufactured without a solder mask layer over the die pad. Thus, the die pad area is lower in height relative to the non-die pad areas by a depth equal to the thickness of the solder mask layer, which is typically around 1 mil. These recessed die pads are then filled with the adhesive composition, using stencil printing or screen printing. Preferably, an amount of adhesive composition is applied until the adhesive layer is flush with the solder mask layer. The recessed die pad is not completely filled-in with the adhesive composition; rather, an amount of the adhesive composition is used such that after die placement, the adhesive composition has flowed underneath the die to cover the previously exposed die pad bottom. This method allows for semiconductor packaging manufacturers to achieve thinner packages without changing the bondline adhesive.

Each of the above described dispensing techniques is used to apply dots of adhesive to a wafer or other surface. The actual shape of the dots, known as the dot profile, will be influenced by the rheology of the adhesive composition. Tails, stringing, and other deleterious effects can result if the rheological parameters of the adhesive composition do not allow for the adhesive material applied to the surface to cleanly break away from the adhesive that remains in the dispensing aperture.

In the case of spray coating, thin semiconductor wafers are desirable substrates on which to coat the adhesive composition. These thin semiconductor wafers have a thickness of about 2-3 mil. Although mechanically robust once properly supported, i.e., bonded onto flexible substrates and encapsulated or overmolded, in their unsupported form thin dice derived from these wafers are fragile and break rather easily. It is therefore advantageous that a method for applying adhesive composition onto thin wafers apply minimal force while doing so.

After the adhesive composition has been applied onto the wafer, chip, die, or substrate using any of the above methods, the adhesive composition may then be dried to remove solvent, if present, or cooled to solidify the adhesive composition.

A typical drying time may be about 30 minutes at a temperature of about 100° C., though any temperature below the cure onset of the curable components of the adhesive composition may be chosen. The length of time may vary depending on the time required for the surface of the adhesive composition to become tack free at the chosen temperature.

Referring to FIG. 2, once die 20 has been brought into intimate contact with substrate 50 so that only adhesive layer 40 remains between them, assembly 10 is formed and die bonding may occur through the curing of the adhesive composition.

Conditions suitable for curing the adhesive composition include subjecting the adhesive composition to a temperature of at least about 150° C., desirably less than 300° C., for about 0.5 up to about 2 minutes. A typical curing condition is a time of about 10 seconds at a temperature of about 100° C. using 500 cN spread, in the case of a 7.6 mm×7.6 mm die. This rapid, short duration heating can be accomplished in a variety of ways, e.g., with in-line snap cure stations such as those manufactured by Nihon Sanso, a heated stage mounted on the diebonder, or an IR beam provided by an EFOS Novacure IR unit.

The invention also provides a method for adhesively attaching a die 20 to a substrate 50, such as a circuit board, to form an assembly 10. The method includes: providing the die 20 and a substrate 50 where an adhesive layer 40 is disposed on either the die 20 or the substrate 50; adjoining the die 20 with the substrate 50 to form an assembly 10 where the die 20 and the substrate 50 are separated only by a layer 40 of the adhesive composition; and exposing the so-formed assembly 10 to a temperature condition sufficient to cure the adhesive composition.

The present invention will be further exemplified through the following non-limiting examples, which demonstrate the preparation of adhesive compositions of the present invention, as well as comparisons of such adhesive compositions with comparative compositions which employ other filler materials. Unless otherwise indicated in the examples and elsewhere in the specification and claims, all parts and percentages are by weight, temperatures are in degrees Kelvin, and pressures are at or near atmospheric pressure.

EXAMPLES

Example 1

Resin component A was prepared according to the formulation set forth in Table 1.

TABLE 1

| Resin Composition | |
|---|---|
| | Resin A (% wt.) |
| Bismaleimide[1] | 17.35 |
| Acrylate[2] | 61.95 |
| Polybutadiene Rubber[3] | 5 |
| Silane[4] | 1.2 |

TABLE 1-continued

| Resin Composition | |
|---|---|
| | Resin A (% wt.) |
| Radical Initiator[5] | 2.5 |
| Acrylate[6] | 12 |

[1]1,20-bismaleimido-10,11-dioctyl-eicosane.
[2]An acrylate made in accordance with Example 1 of U.S. Pat. No. 6,211,320.
[3]Ricon 130MA-20, available commercially from Sartomer.
[4]3 wt % Silquest A-186 plus 1 wt % Silquest A-174, each available commercially from GE Advanced Materials.
[5]1.0 wt % USP90MD, available commercially from Chemtura Corporation.
[6]22 wt % 1-vinyloxy-2-decyl tetradecane.

Resin A from Table 1 was prepared by mixing the various components in a step-wise fashion until a homogenous mixture was obtained. A high speed mixer was used to disperse and dissolve the various components.

Resin A from Table 1 was then combined and mixed with conductive filler materials according to the formulation set forth in Table 2. Pure copper was not used as a potential filler material because of copper oxidizes during manufacture and handling making it improper to use as the sole component of a filler material.

TABLE 2

| | Sample | |
|---|---|---|
| Component | 1 | 2 |
| Resin A | 20 | 20 |
| Ag[1] | 80 | — |
| Ag/Cu Alloy[2] | — | 80 |

[1]Pure Ag flake material.
[2]AACu-3001, 50/50 Cu/Ag alloy commercially available from Metalor Technologies USA.

Samples 1 and 2 from Table 2 were compared with commercial products for their thermal conductivity. In particular, Samples 1 and 2 were compared with known silver-filled adhesive compositions and known solder pastes for comparison of thermal conductivity. Each of Samples 1 and 2 and the commercial products identified herein were used as adhesive compositions for bonding a Si die to a metal leadframe surface. The adhesive is first applied to the substrate in the desired pattern, for example, as a series of dots, and then the Si die is placed on the adhesive. Pressure is applied on the die while lowering it to the desired bondline thickness, typically 1.0 mil.

The testing vehicle used is a high powered LED. Specifically, the LED used for the testing is a SemiLED 1 W blue LED with a feature size of 1 mm×1 mm and an emitting wavelength of 460 nm, and Ag coated Cu-leadframes designed for power LEDs. An adjustable pulse current source with corresponding forward voltage was supplied by a power generator, manufactured by Everfine Inc. The light output of the LEDs was measured using the integral sphere method with an apparatus from LabSphere, Inc. A package was constructed and thermal resistance measured between the die and the substrate. The thermal resistance value ($R_{j-b}$ (K/W)) is a measure of the die attach material's thermal performance and a lower value indicates a more thermally conductive material.

The results of this thermal testing are shown in Table 3.

TABLE 3

Results

| | SAMPLE | | | | |
|---|---|---|---|---|---|
| | 1 | 2 | 3[a] | 4[b] | 5[c] |
| Filler Loading (wt %) | 80 | 80 | 83 | 84.4 | 87 |
| Junction $T_j$ (K) | 40.3 | 40.4 | 41.2 | 40.4 | 41.1 |
| $\Delta T_{j-b}$ (K) | 4.4 | 4.0 | 4.5 | 3.8 | 3.2 |
| Forward Voltage (V) | 3.131 | 3.240 | 3.198 | 3.162 | 3.389 |
| Power Input (W) | 1.096 | 1.134 | 1.119 | 1.107 | 1.186 |
| Optical Output (mW) | 201.4 | 205.0 | 195.0 | 201.9 | 192.3 |
| Thermal Resistance $R_{j-b}$ (K/W) | 4.9 | 4.3 | 4.9 | 4.2 | 3.2 |

[a]Hysol QMI 529LB, a silver-filled conductive die attach adhesive commercially available from Henkel Corporation.
[b]Hysol QMI 529HT, a highly silver-filled conductive adhesive commercially available from Henkel Corporation.
[c]Hysol QMI 519HT02, a highly silver-filled conductive adhesive commercially available from Henkel Corporation.

The thermal resistance is a measure of the resistance to heat flow across a substance. If the thermal resistance value is low, heat can readily transfer through the substance. In the area of conductive adhesive compositions, a low thermal resistance value is preferred. As is apparent from the data of Table 3, the inventive composition of Sample 2 shows particular improvement in thermal conductivity (demonstrated through the reduced thermal resistance) when directly compared with Sample 1, which represents the same resin but with a pure silver filler (Sample 1) as opposed to the silver-copper alloy filler (Sample 2). Moreover, when the inventive composition of Sample 2 is compared with other commercially available highly silver-filled adhesive compositions and other solder pastes, the thermal conductivity is greatly improved over the conventional solder pastes and is comparable to highly silver-filled commercial products.

Example 2

Resin B was prepared according to the formulations set forth in Table 4.

TABLE 4

| | Resin B (% wt.) |
|---|---|
| Bismaleimide[1] | 51.75 |
| Acrylate[2] | 29.1 |
| Polybutadiene Rubber[3] | 5 |
| Silane[4] | 2.0 |
| Radical Initiator[5] | 2.0 |
| Acrylate[6] | 9 |
| Additive (adhesion promoter) | 1.15 |

[1]Includes 25 wt % 1,20-bismaleimido-10,11-dioctyl-eicosane and 26.75 wt % Citraconimid BMI.
[2]SR 541, available commercially from Sartomer.
[3]13.0 wt % Ricon 130 MA-20, available commercially from Sartomer.
[4]3 wt % Silquest A-186 plus 1 wt % Silquest A-174, available commercially from GE Advanced Materials.
[5]1.0 wt % USP90MD, available commercially from Chemtura Corporation
[6]22 wt % 1-vinyloxy-2-decyl tetradecane Resin B from Table 4 was prepared by mixing various components in a step-wise fashion until a homogenous mixture was obtained. A high speed mixer was used to disperse and dissolve the various components.

Each of Resins A from Table 1 and Resin B was then combined and mixed with various conductive filler materials according to the formulations set forth in Table 5.

TABLE 5

| Component (wt %) | Sample | | | | | | | | |
|---|---|---|---|---|---|---|---|---|---|
| | 6 | 7 | 8 | 9 | 10 | 11 | 12 | 13 | 14 |
| Resin A | 20 | 20 | 20 | 20 | 20 | 20 | 20 | 0 | 0 |
| Resin B | 0 | 0 | 0 | 0 | 0 | 0 | 0 | 20 | 20 |
| Ag/Cu Alloy[1] | 0 | 0 | 40 | 40 | 80 | 0 | 0 | 80 | 0 |
| Ag[2] | 80 | 0 | 40 | 0 | 0 | 0 | 0 | 0 | 80 |
| Ag[3] | 0 | 80 | 0 | 40 | 0 | 0 | 0 | 0 | 0 |
| Ag[4] | 0 | 0 | 0 | 0 | 0 | 80 | 0 | 0 | 0 |
| Ag[5] | 0 | 0 | 0 | 0 | 0 | 0 | 80 | 0 | 0 |

[1]AACu-3001, 50/50 Cu/Ag alloy commercially available from Metalor Technologies USA.
[2]AA192N, Ag flake commercially available from Metalor Technologies USA.
[3]SF-118, Ag flake commercially available from Ferro Electronic Material Systems.
[4]EA 3106, Ag flake commercially available from Ferro Electronic Material Systems.
[5]SF39, Ag flake commercially available from Ferro Electronic Material Systems.

Each of Samples 6-14, identified in Table 5, was tested to determine viscosity. The results are set forth in Table 6.

TABLE 6

Viscosity, Thixotropy, and Volume Resistance Results

| | 6 | 7 | 8 | 9 | 10 | 11 | 12 | 13 | 14 |
|---|---|---|---|---|---|---|---|---|---|
| Viscosity @ 5 rpm and 25° C. (cps) | 9485.79 | 10801.55 | 11684.74 | 12833.7 | 13867.71 | 10408.09 | 6582.74 | 25000 | 13000 |
| Viscosity @ 20 rpm and 25° C. (cps) | 5466.44 | 7974.84 | 7958.4 | 9670.12 | 10726.54 | 7176.71 | 4385.33 | 14000 | 6200 |
| Thixotropy 0.5/5 | 5.04 | 3.93 | 3.62 | 3.32 | 2.95 | 3.54 | 3.57 | 3.3 | 6 |
| Thixotropy 1/20 | 4.57 | 3.07 | 3.46 | 2.78 | 2.51 | 3.25 | 3.43 | 3.8 | 7.1 |

Each of Samples 6-14, identified in Table 5, were also tested to determine the viscosity and thixotropic ratio of the sample. Specifically, the viscosity was determined at 0.5 rpm, 2.5 rpm, 5 rpm, 10 rpm, and 20 rpm by a cone and plate Brookfield Viscometer using a No. CP52 spindle at 25° C. The thixotropy value was determined by calculating the ratio of the viscosities at two different shear rates. The thixotropy values calculated here were done by dividing the viscosity at 0.5 rpm with that at 5 rpm and also comparing the viscosity at 1 rpm to that at 20 rpm. The thixotropy values show the dependency of the adhesive samples to a change in the shear stress, or agitation, applied to them. An adhesive with a high thixotropy value generally returns to equilibrium, and solid-state behavior, faster upon the cessation of the shear stress than an adhesive with a low thixotropy value. The results of these tests are set forth in Table 6. These results indicate that the inventive composition demonstrates viscosity and thixotropy consistent with that observed for commercially accepted products that use solely silver as the conductive filler.

Referring again to Table 5, Samples 6-14 were subjected to a dispensing process to determine the dispensability of the adhesive compositions. The test was carried out by varying the distance the dispensing tip had to move vertically away from the substrate after dispensing the adhesive composition, known as the retract height. Also, the height from the substrate of the dispensing tip was varied while the adhesive composition was being dispensed, known as the dispense height. The relationship between the dispense height and the retract height affects the string-forming behavior of the adhesive composition as it is being dispensed. The adhesive composition that provides minimal string formation over a wide range of height variances is desirable for die attach application.

I claim:

1. An adhesive composition, comprising:
    a curable resin component;
    a curing agent for the resin component; and
    a filler material comprising an alloy of copper and silver, wherein the alloy comprises from about 10% to about 85% by weight copper based on the total weight of the alloy and has a tap density between about 2 and 8 g/cm$^3$ and a mean particle size of between about 1 and about 20 µm.

2. The composition of claim 1, wherein the filler comprises elemental silver.

3. The composition of claim 2, wherein the elemental silver is present in an amount of from about 5% to about 50% by weight based on the total weight of the composition.

4. The composition of claim 2, wherein the filler material is present in amounts of about 50% to about 95% by weight based on the total weight of the composition.

5. The composition of claim 1, wherein the alloy comprises from about 45% to about 65% by weight copper based on the total weight of the alloy.

6. The composition of claim 1, wherein the curable resin component is selected from the group consisting of: epoxies, episulfides, maleimides, itaconimides, nadimides, (meth) acrylates, and combination thereof.

7. The composition of claim 1, wherein the curable resin component comprises bismaleimide.

8. The semiconductor device of claim 1, wherein the first substrate is a semiconductor chip.

9. The semiconductor device of claim 1, wherein the second substrate is a circuit board or a metal leadframe.

10. A semiconductor device, comprising:
    a first substrate;
    a second substrate; and
    a reaction product of an adhesive composition of claim 1, wherein said adhesive composition forms a conductive interface layer between said first substrate and said second substrate.

11. A method of bonding two or more substrates comprising the steps of:
    providing at least two substrates;
    dispensing on a surface of one or both of the at least two substrates an adhesive composition of claim 1;
    contacting the surfaces of the at least two substrates having the adhesive composition thereon; and
    exposing the adhesive composition to cure conditions.

12. A dispensable composition, comprising:
    a curable resin component;
    a curing agent for the resin component; and
    a filler material comprising an alloy of copper and silver, wherein, when the filler material is present in an amount of 80% by weight based on the weight of the composition, the dispensable composition has a thermal resistance of between about 4.0 and about 5.0 K/W and a 1 rpm/20 rpm thixotropy value of below 3.0.

* * * * *